(12) United States Patent
Park

(10) Patent No.: US 10,373,938 B2
(45) Date of Patent: Aug. 6, 2019

(54) LIGHT EMITTING ELEMENT

(71) Applicant: LG INNOTEK CO., LTD., Seoul (KR)

(72) Inventor: Yong Nam Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/068,312

(22) PCT Filed: Jan. 5, 2017

(86) PCT No.: PCT/KR2017/000123
§ 371 (c)(1),
(2) Date: Jul. 5, 2018

(87) PCT Pub. No.: WO2017/119730
PCT Pub. Date: Jul. 13, 2017

(65) Prior Publication Data
US 2019/0019782 A1 Jan. 17, 2019

(30) Foreign Application Priority Data
Jan. 5, 2016 (KR) .................. 10-2016-0000915

(51) Int. Cl.
*H01L 33/36* (2010.01)
*H01L 25/075* (2006.01)
(Continued)

(52) U.S. Cl.
CPC ........ *H01L 25/0753* (2013.01); *H01L 25/075* (2013.01); *H01L 25/16* (2013.01); *H01L 33/36* (2013.01); *H01L 33/62* (2013.01)

(58) Field of Classification Search
CPC ... H01L 25/075; H01L 25/0753; H01L 33/36; H01L 33/38; H01L 33/382; H01L 33/387
See application file for complete search history.

(56) References Cited

U.S. PATENT DOCUMENTS

2006/0087227 A1 4/2006 Yamanaka
2011/0204387 A1 8/2011 Kim et al.
(Continued)

FOREIGN PATENT DOCUMENTS

JP 2006-120477 A 5/2006
JP 2011-171739 A 9/2011
(Continued)

*Primary Examiner* — Cuong Q Nguyen
(74) *Attorney, Agent, or Firm* — Birch, Stewart, Kolasch & Birch, LLP

(57) ABSTRACT

A light-emitting element provides a substrate; a plurality of light-emitting cells arranged on the substrate and spaced apart from each other; a connection wire configured to electrically interconnect the light-emitting cells; a first bonding pad electrically connected to the second conductive semiconductor layer of a first light-emitting cell among the light-emitting cells; and a second bonding pad electrically connected to the first conductive semiconductor layer of a second light-emitting cell among the light-emitting cells, wherein a boundary area includes a first boundary disposed between the light-emitting cells adjacent to each other in a first direction among the plurality of light-emitting, and wherein all of the first boundary areas are spaced apart from each other in the first direction.

20 Claims, 7 Drawing Sheets

(51) Int. Cl.
  *H01L 25/16* (2006.01)
  *H01L 33/62* (2010.01)

(56) References Cited

U.S. PATENT DOCUMENTS

| | | | |
|---|---|---|---|
| 2014/0183572 A1 | 7/2014 | Kim et al. | |
| 2015/0146426 A1* | 5/2015 | Yeh | H01L 25/0753 |
| | | | 362/249.06 |
| 2017/0047494 A1* | 2/2017 | Yeh | H01L 27/156 |
| 2018/0233630 A1* | 8/2018 | Jing | H01L 25/0753 |

FOREIGN PATENT DOCUMENTS

| | | |
|---|---|---|
| KR | 10-2011-0095772 A | 8/2011 |
| KR | 10-2013-0007213 A | 1/2013 |
| KR | 10-2013-0087767 A | 8/2013 |
| KR | 10-2014-0084581 A | 7/2014 |

* cited by examiner

【FIG. 1】
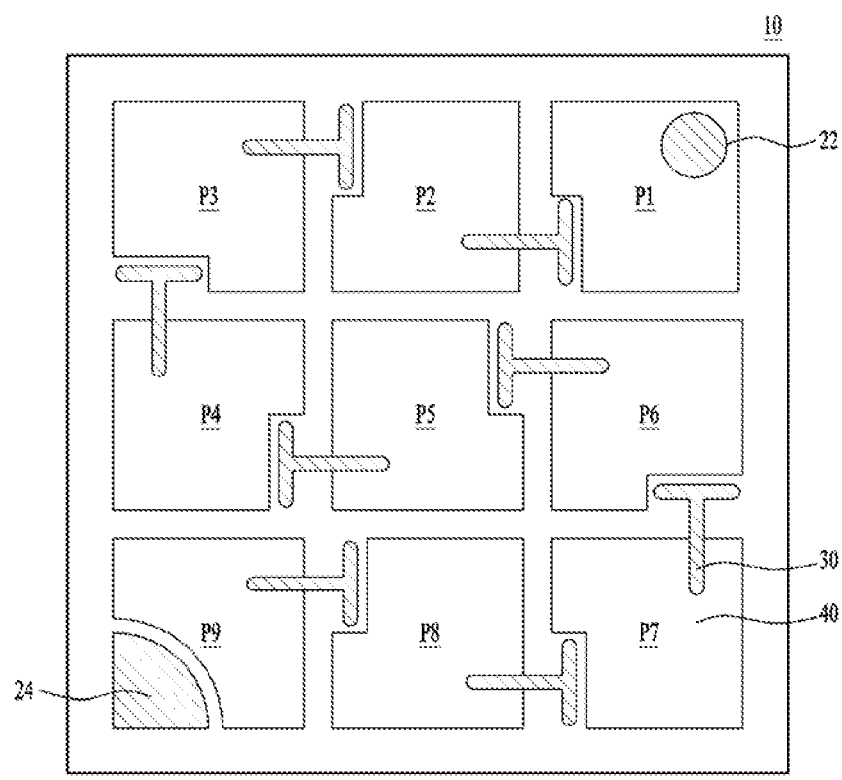

[FIG. 2]
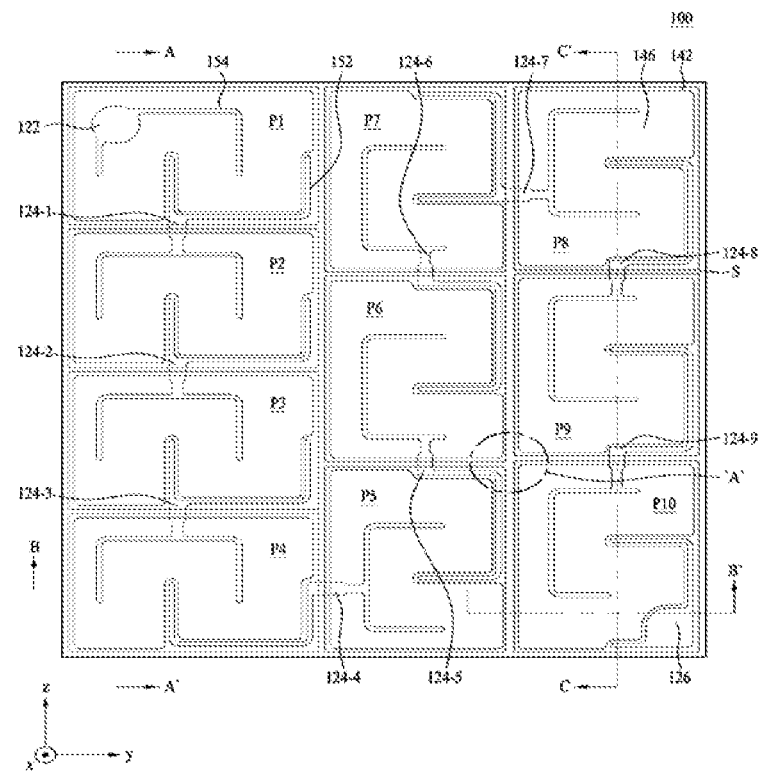
[FIG. 3]
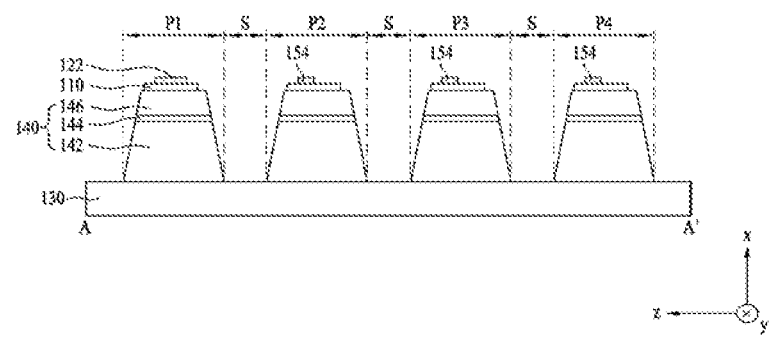

【FIG. 4】
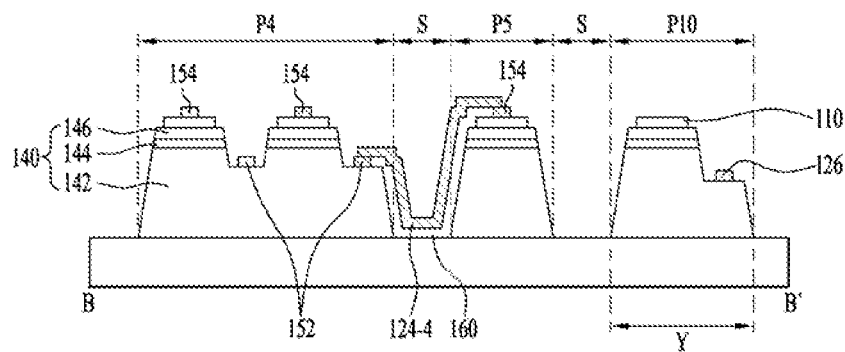
【FIG. 5】
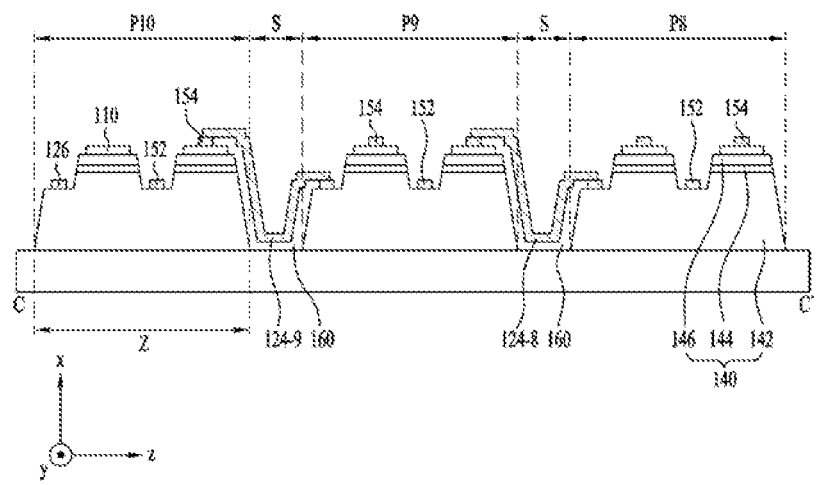
【FIG. 6】
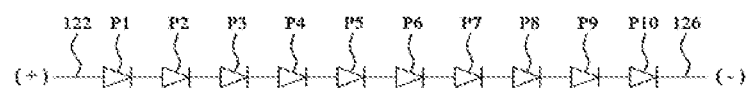

[FIG. 7]
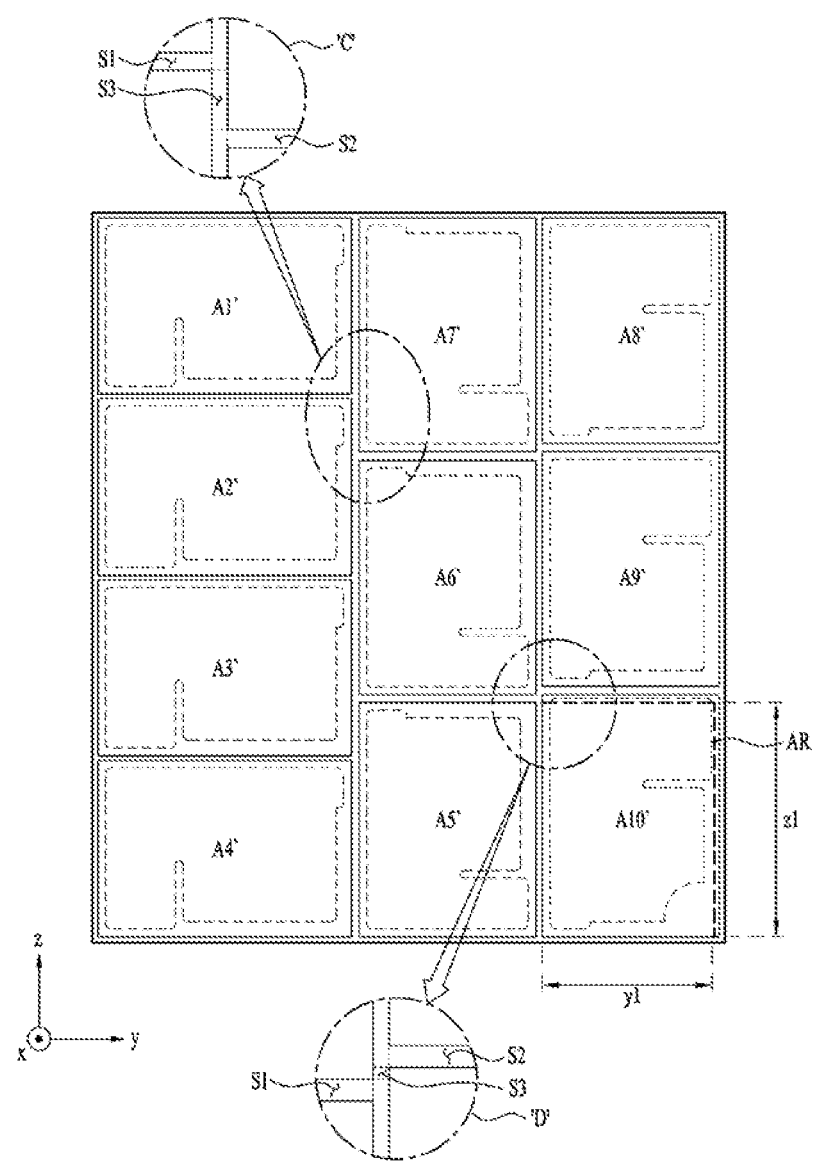

[FIG. 8]
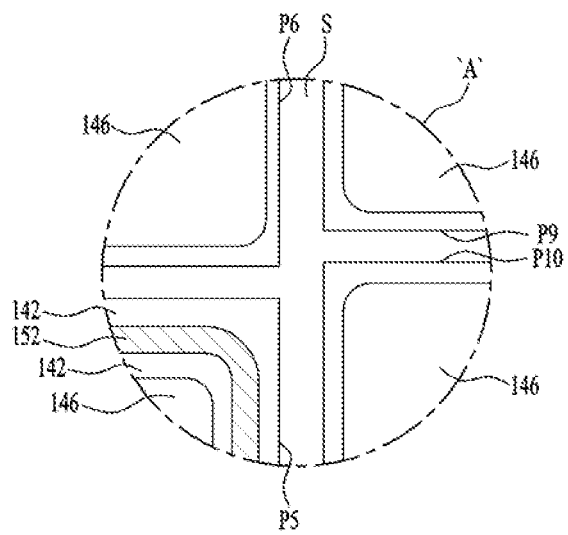
[FIG. 9]
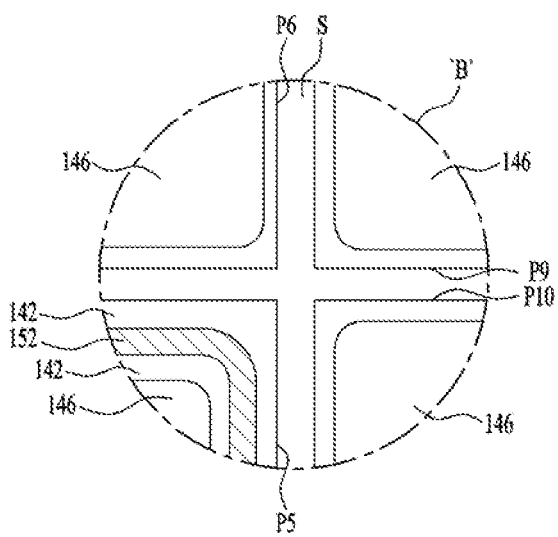

[FIG. 10]
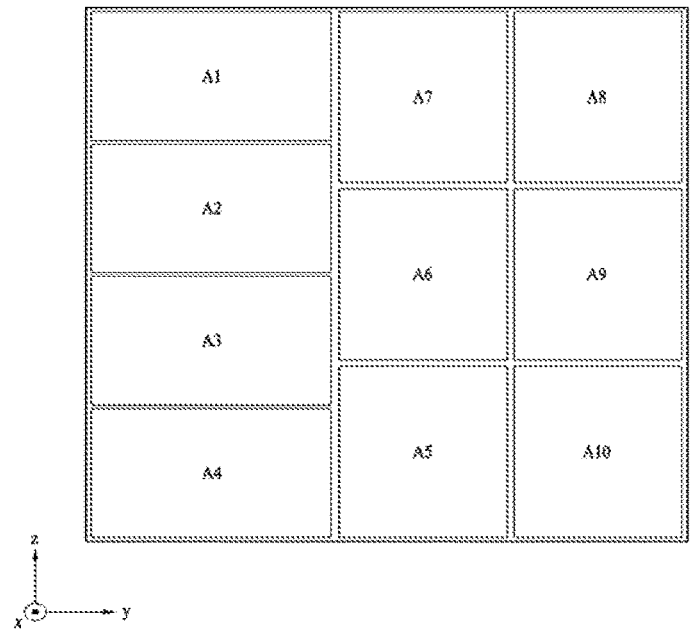
[FIG. 11]
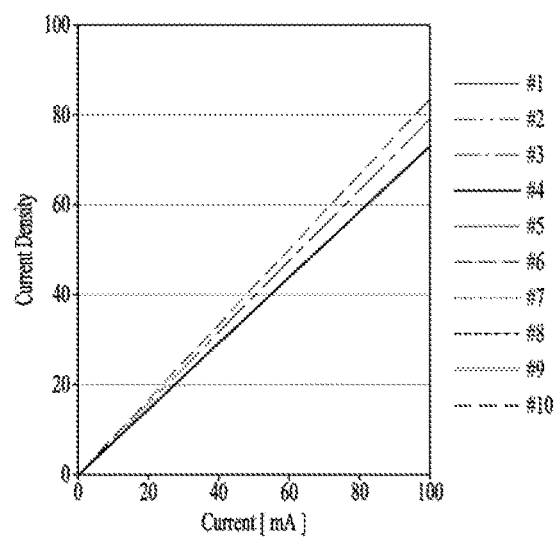

[FIG. 12]
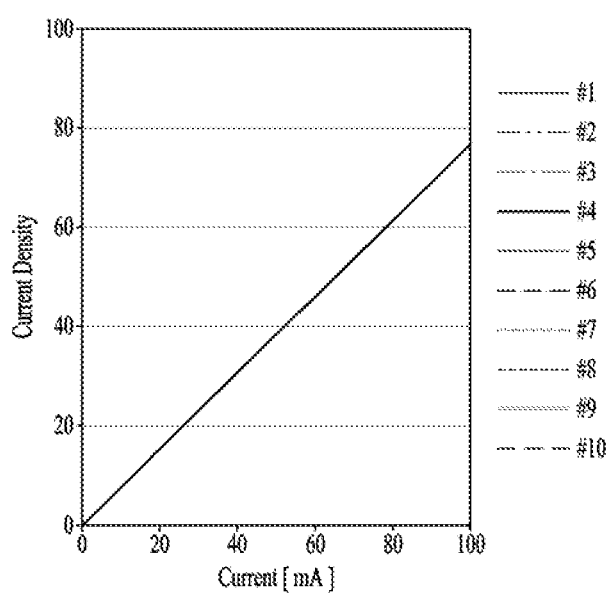

LIGHT EMITTING ELEMENT

CROSS REFERENCE TO RELATED APPLICATIONS

This application is the National Phase of PCT International Application No. PCT/KR2017/000123, filed on Jan. 5, 2017, which claims priority under 35 U.S.C. 119(a) to Patent Application No. 10-2016-0000915, filed in the Republic of Korea on Jan. 5, 2016, which is hereby expressly incorporated by reference into the present application.

TECHNICAL FIELD

Embodiments relate to a light-emitting element.

BACKGROUND ART

Red, green, and blue light-emitting diodes (LEDs), which are capable of realizing high brightness and white light, have been developed based on the development of a gallium nitride (GaN) metal-organic chemical vapor deposition and a molecular beam growth method, for example.

Such LEDs have excellent environmental friendliness because they include no environmentally harmful materials such as mercury (Hg), which has conventionally been used in lighting apparatuses such as incandescent lamps and fluorescent lamps, and also have other advantages, for example, a long lifespan and low power consumption. Therefore, existing light sources are being replaced with LEDs. A competitive core factor of LEDs is the realization of high brightness by high-efficiency and high-output chip and packaging techniques.

In order to realize high brightness, it is important to increase light extraction efficiency. Various methods using a flip-chip structure, surface texturing, a patterned sapphire substrate, a photonic crystal technique, an anti-reflection layer structure, and the like have been studied in order to increase light extraction efficiency.

FIG. 1 illustrates a plan view of a conventional light-emitting element 10.

The light-emitting element 10 illustrated in FIG. 1 includes first and second electrode pads (or bonding pads) 22 and 24, nine emission areas (or light-emitting cells) 40, and a connection metal 30 that electrically interconnects the neighboring emission areas 40. Here, due to the placement of the second electrode pad 24, the planar area of an active layer in a ninth emission area P9 is less than the planar area of an active layer in the other first to eighth emission areas P1 to P8. Due to this, the current density of the ninth emission area P9 may be greater than the current density of the other first to eighth emission areas P1 to P8. This may cause damage to the connection metal 30 that electrically interconnects the eighth emission area P8 and the ninth emission area P9, thus causing the light-emitting element 10 to be electrically opened, which may deteriorate the reliability of the light-emitting element.

Technical Object

Embodiments provide a light-emitting element having improved electrical reliability.

Technical Solution

One embodiment may include a light-emitting element including a substrate; a plurality of light-emitting cells arranged on the substrate and spaced apart from each other, each of the light-emitting cells including a first conductive semiconductor layer, an active layer, and a second conductive semiconductor layer sequentially disposed on the substrate; a connection wire configured to electrically interconnect the light-emitting cells; a first bonding pad electrically connected to the second conductive semiconductor layer of a first light-emitting cell among the light-emitting cells; and a second bonding pad electrically connected to the first conductive semiconductor layer of a second light-emitting cell among the light-emitting cells, wherein at least one remaining light-emitting cell, excluding the second light-emitting cell, among the light emitting cells, has a planar area smaller than a planar area of the second light-emitting cell, wherein the light-emitting cells are separated from each other on a plane by a boundary area located around the light-emitting cells, wherein the light-emitting cells includes: first adjacent light-emitting cells adjacent to each other in a first direction; and second adjacent light-emitting cells adjacent to each other in the first direction and adjacent to the first adjacent light-emitting cells in a second direction orthogonal to the first direction, and wherein the boundary area includes: a first boundary area disposed between the first adjacent light-emitting cells; and a second boundary area disposed between the second adjacent light-emitting cells and spaced apart from the first boundary area in the first direction.

For example, a uniformity of planar areas of the active layers of the light-emitting cells may range from 0.01% to 1%. The uniformity of the planar areas of the active layers of the light-emitting cells may be 0.03%.

For example, the at least one remaining light-emitting cell may include a plurality of remaining light-emitting cells, and planar areas of the remaining light-emitting cells may be different within the range of the uniformity.

For example, the at least one remaining light-emitting cell may include a plurality of remaining light-emitting cells, and planar areas of the remaining light-emitting cells may be the same.

For example, a first planar area of the at least one remaining light-emitting cell, excluding the second light-emitting cell, among the light-emitting cells, and a second planar area of the second light-emitting cell may have a relationship as follows:

$$AN' - Ai' = \frac{\alpha N}{(N-1)}$$

Here, "Ai'" indicates the first planar area, $1 \leq i \leq N-1$, "AN'" indicates the second planar area, indicates a total number of light-emitting cells and is a positive integer of 2 or more, and "α" indicates a planar area of the second bonding pad.

For example, the second light-emitting cell may have a horizontal width greater than a horizontal width of the at least one remaining light-emitting cell and a vertical width equal to a vertical width of the at least one remaining light-emitting cell. Alternatively, wherein the second light-emitting cell may have a vertical width greater than a vertical width of the at least one remaining light-emitting cell and a horizontal width equal to a horizontal width of the at least one remaining light-emitting cell. Alternatively, the second light-emitting cell may have a horizontal width greater than a horizontal width of the at least one remaining light-emitting cell and a vertical width greater than a vertical width of the at least one remaining light-emitting cell.

For example, wherein the first conductive semiconductor layer may be an n-type semiconductor layer, the second conductive semiconductor layer may be a p-type semiconductor layer, and each of the light-emitting cells may have a horizontal bonding structure.

For example, one or more of the light-emitting cells may have a major-axis or minor-axis direction different from a major-axis or minor-axis direction of the remaining light-emitting cells among the light-emitting cells. For example, a major-axis or minor-axis direction of the second light-emitting cell may be different from a major-axis or minor-axis direction of the first light-emitting cell.

Another embodiment provides a light-emitting element including a substrate; first to $N^{th}$ light-emitting cells disposed on the substrate and spaced apart from each other (here, "N" is a positive integer of 2 or more); first to $N-1^{th}$ connection wires configured to electrically interconnect the first to $N^{th}$ light-emitting cells; a first bonding pad located in the first light-emitting cell among the first to $N^{th}$ light-emitting cells; and a second bonding pad located in the $N^{th}$ light-emitting cell among the first to $N^{th}$ light-emitting cells, wherein a second planar area of the $N^{th}$ light-emitting cell is greater than a reference planar area by an incremental amount, and each light-emitting cell, excluding the $N^{th}$ light-emitting cell, among the first to $N^{th}$ light-emitting cells has a first planar area as follows, wherein the first to $N^{th}$ light-emitting cells are separated from each other on a plane by a boundary area located around the first to $N^{th}$ light-emitting cells, wherein the light-emitting cells includes: first adjacent light-emitting cells adjacent to each other in a first direction; and second adjacent light-emitting cells adjacent to each other in the first direction and adjacent to the first adjacent light-emitting cells in a second direction orthogonal to the first direction, and wherein the boundary area includes: a first boundary area disposed between the first adjacent light-emitting cells; and a second boundary area disposed between the second adjacent light-emitting cells and spaced apart from the first boundary area in the first direction.

$$Ai' = AR - \frac{\alpha}{(N-1)}$$

Here, "Ai'" indicates the first planar area, "AR" indicates the reference planar area, and "α" indicates the incremental amount.

For example, each of the first to $N^{th}$ light-emitting cells may include an n-type semiconductor layer disposed on the substrate, an active layer disposed on the n-type semiconductor layer, a p-type semiconductor layer disposed on the active layer, an n-type electrode disposed on the n-type semiconductor layer that is exposed by mesa etching the p-type semiconductor layer and the active layer, and a p-type electrode disposed on the p-type semiconductor layer, and For example, a uniformity of planar areas of the active layers of the first to $N^{th}$ light-emitting cells may range from 0.01% to 1%. The incremental amount may be equal to a planar area of the second bonding pad.

For example, one or more of the first to $N^{th}$ light-emitting cells may have a major-axis or minor-axis direction different from a major-axis or minor-axis direction of the remaining light-emitting cells among the first to $N^{th}$ light-emitting cells. For example, a major-axis or minor-axis direction of the $N^{th}$ light-emitting cell may be different from a major-axis or minor-axis direction of the first light-emitting cell.

Advantageous Effects

In a light-emitting element according to embodiments, there is no difference in current density between a plurality of light-emitting cells due to the uniform planar area of an active layer. Therefore, the light-emitting element may achieve improved reliability since there is no risk of element breakage, may realize a reduced defect rate under the occurrence of any abnormal situation such as overcurrent or electrostatic discharge (ESD), may be suitably used for a high-voltage element, and may have enhanced light uniformity since boundary areas are not disposed in a line with each other but are disposed so as to be out of line in a plane to cause the scattering of light.

DESCRIPTION OF DRAWINGS

FIG. 1 illustrates a plan view of a conventional light-emitting element.

FIG. 2 illustrates a plan view of a light-emitting element according to an embodiment.

FIG. 3 illustrates a cross-sectional view taken along line A-A' of FIG. 2.

FIG. 4 illustrates a cross-sectional view taken along line B-B' of FIG. 2.

FIG. 5 illustrates a cross-sectional view taken along line C-C' of FIG. 2.

FIG. 6 illustrates a circuit diagram of the light-emitting element illustrated in FIG. 2.

FIG. 7 illustrates a plan view of the light-emitting element illustrated in FIG. 2.

FIG. 8 illustrates an enlarged cross-sectional view of portion "A" illustrated in FIG. 2.

FIG. 9 illustrates a cross-sectional view of a comparative example of portion "A" illustrated in FIG. 2.

FIG. 10 illustrates a plan view of a light-emitting element according to a comparative example.

FIG. 11 illustrates the current density of first to tenth light-emitting cells in the light-emitting element according to the comparative example illustrated in FIG. 10.

FIG. 12 illustrates the current density of first to tenth light-emitting cells in the light-emitting element according to the embodiment.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Hereinafter, a light-emitting element 100 according to an embodiment will be described using the Cartesian coordinate system, but the embodiment is not limited thereto. That is, the light-emitting element 100 according to the embodiment may be described using any other coordinate system. In addition, with the Cartesian coordinate system, the x-axis, the y-axis and the z-axis may be orthogonal to one another, but the embodiment is not limited thereto. That is, the x-axis, the y-axis and the z-axis may cross one another.

FIG. 2 illustrates a plan view of the light-emitting element 100 according to an embodiment, FIG. 3 illustrates a cross-sectional view taken along line A-A' of FIG. 2, FIG. 4 illustrates a cross-sectional view taken along line B-B' of FIG. 2, and FIG. 5 illustrates a cross-sectional view taken along line C-C' of FIG. 2.

Referring to FIGS. 2 to 5, the light-emitting element 100 may include a conductive layer 110, a first bonding pad 122, first to N–1$^{th}$ connection wires 124-1 to 124-(N-1) (here, N being a positive integer of 2 or more), a second bonding pad 126, a substrate 130, and a light-emitting structure 140.

The substrate 130 may be formed of a material that is suitable for the growth of a semiconductor material, such as a carrier wafer. In addition, the substrate 130 may be formed of a highly thermally conductive material, and may be a conductive substrate or an electrically insulating substrate. In addition, the substrate 130 may be formed of a light-transmitting material, and may have mechanical strength required to easily separate the entire nitride light-emitting structure 140 of the light-emitting element into separate chips through a scribing process and a breaking process without causing bending of the light-emitting structure. For example, the substrate 130 may be formed of a material including at least one of sapphire ($Al_2O_3$), GaN, SiC, ZnO, Si, GaP, InP, $Ga_2O_3$, GaAs, or Ge. The upper surface of the substrate 130 may have a patterned form. For example, although not illustrated, the substrate 130 may be a patterned sapphire substrate (PSS).

In addition, although not illustrated, a buffer layer may further be disposed between the substrate 130 and the light-emitting structure 140. The buffer layer may be formed using a group III-V compound semiconductor. The buffer layer serves to reduce a difference in lattice constant between the substrate 130 and the light-emitting structure 140. For example, the buffer layer may include AlN or an undoped nitride, without being limited thereto. The buffer layer may be omitted according to the kind of the substrate 130 and the kind of the light-emitting structure 140.

Hereinafter, for convenience of description, it is assumed that N is 10, but the embodiment is not limited thereto, and the following description may be equally applied even when N is greater than or less than 10.

Light-emitting cells are spaced apart from each other above the substrate 130 in the horizontal direction (e.g., the y-axis and z-axis directions).

First, multiple emission areas are sequentially referred to as a first emission area P1 to an $N^{th}$ emission area PN. That is, the emission area in which the first bonding pad 122 is located is referred to as a first emission area P1, and the emission area in which the second bonding pad 126 is located is referred to as a tenth emission area.

First to $N^{th}$ light-emitting cells are disposed respectively in the first to $N^{th}$ emission areas P1 to PN of the substrate 130. That is, the first light-emitting cell is disposed in the first emission area P1 of the substrate 130, the second light-emitting cell is disposed in the second emission area P2 of the substrate 130, the third light-emitting cell is disposed in the third emission area P3 of the substrate 130, the fourth light-emitting cell is disposed in the fourth emission area P4 of the substrate 130, the fifth light-emitting cell is disposed in the fifth emission area P5 of the substrate 130, the sixth light-emitting cell is disposed in the sixth emission area P6 of the substrate 130, the seventh light-emitting cell is disposed in the seventh emission area P7 of the substrate 130, the eighth light-emitting cell is disposed in the eighth emission area P8 of the substrate 130, the ninth light-emitting cell is disposed in the ninth emission area P9 of the substrate 130, and the tenth light-emitting cell is disposed in the tenth emission area P10 of the substrate 130. As such, an $n^{th}$ light-emitting cell N) is disposed in an $n^{th}$ emission area Pn of the substrate 130. Hereinafter, for convenience of description, the $n^{th}$ light-emitting cell is referred to as "Pn".

Each of the first to $N^{th}$ light-emitting cells P1 to PN includes the light-emitting structure 140, the conductive layer 110, a first electrode 152, and a second electrode 154, which are disposed above the substrate 130. The light-emitting structure 140, which constitutes one light-emitting cell, may be separated from the light-emitting structure 140 of another light-emitting cell by a boundary area S. The boundary area S may be an area located around each of the first to $N^{th}$ light-emitting cells P1 to PN, and may be the substrate 130. The boundary area S may be disposed between the first to $N^{th}$ light-emitting cells P1 to PN on a plane.

For convenience of description, each light-emitting cell Pn is illustrated in FIGS. 2 to 5 as having a horizontal bonding structure, but the embodiment is not limited to a specific bonding form of each light-emitting cell. According to another embodiment, each light-emitting cell Pn may have a flip chip bonding structure.

The light-emitting structure 140 of the $n^{th}$ light-emitting cell Pn may include a first conductive semiconductor layer 142, an active layer 144, and a second conductive semiconductor layer 146, which are sequentially disposed above the substrate 130.

The first conductive semiconductor layer 142 may be disposed between the substrate 130 and the active layer 144, may include a semiconductor compound, may be formed of a compound semiconductor such as a group III-V or II-VI compound semiconductor, and may be doped with a first conductive dopant. For example, the first conductive semiconductor layer 142 may include a semiconductor material having a composition of $Al_xIn_yGa_{(1-x-y)}N$ ($0 \leq x \leq 1$, $0 \leq y \leq 1$, $0 \leq x+y \leq 1$), i.e. one or more of InAlGaN, AlGaAs, GaP, GaAs, GaAsP, and AlGaInP. When the first conductive semiconductor layer 142 is an n-type semiconductor layer, the first conductive dopant may be an n-type dopant, such as Si, Ge, Sn, Se, or Te. The first conductive semiconductor layer 142 may be formed in a single layer or in multiple layers, without being limited thereto.

The active layer 144 may be disposed between the first conductive semiconductor layer 142 and the second conductive semiconductor layer 146, and may have any one of a single-well structure, a multi-well structure, a single-quantum well structure, a multi-quantum well (MQW) structure, a quantum wire structure, or a quantum dot structure. The active layer 144 may use a group III-V compound semiconductor material, and may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/

AlGaP, for example, without being limited thereto. The well layer may be formed of a material having lower band gap energy than the band gap energy of the barrier layer.

The second conductive semiconductor layer 146 may be disposed on the active layer 144, and may include a semiconductor compound. The second conductive semiconductor layer 146 may be formed of a compound semiconductor such as a group III-V or II-VI compound semiconductor, and for example, may include a semiconductor material having a composition of $In_xAl_yGa_{1-x-y}N$ ($0 \leq x \leq 1$, $0 \leq y \leq 1$, $0 \leq x+y \leq 1$), or one or more selected from among AlInN, AlGaAs, GaP, GaAs, GaAsP, and AlGaInP.

The second conductive semiconductor layer 146 may be a second conductive semiconductor layer. When the second conductive semiconductor layer 146 is a p-type semiconductor layer, a second conductive dopant may be a p-type dopant, such as Mg, Zn, Ca, Sr, or Ba. The second conductive semiconductor layer 146 may be formed in a single layer or in multiple layers, without being limited thereto.

The first conductive semiconductor layer 142 may be an n-type semiconductor layer and the second conductive semiconductor layer 146 may be a p-type semiconductor layer, or the first conductive semiconductor layer 142 may be a p-type semiconductor layer and the second conductive semiconductor layer 146 may be an n-type semiconductor layer. Thereby, the light-emitting structure 140 may have at least one of an n-p junction structure, a p-n junction structure, an n-p-n junction structure, or a p-n-p junction structure.

Hereinafter, the case in which the first conductive semiconductor layer 142 is an n-type semiconductor layer and the second conductive semiconductor layer 146 is a p-type semiconductor layer will be described, but the embodiment is not limited thereto. Conversely, the present embodiment may also be applied to the case in which the first conductive semiconductor layer 142 is a p-type semiconductor layer and the second conductive semiconductor layer 146 is an n-type semiconductor layer.

In the respective light-emitting cells P1 to PM, the first electrode 152 is disposed on the first conductive semiconductor layer 142. For example, referring to FIG. 4, in the fourth light-emitting cell P4, the first electrode 152 may be disposed on the first conductive semiconductor layer 142, and referring to FIG. 5, in each of the eighth, ninth, and tenth light-emitting cells P8, P9 and P10, the first electrode 152 may be disposed on the first conductive semiconductor layer 142.

In order to dispose the first electrode 152 on the first conductive semiconductor layer 142, a portion of the first conductive semiconductor layer 142 of the light-emitting structure 140 may be exposed. That is, a portion of the first conductive semiconductor layer 142 may be exposed by mesa etching the second conductive semiconductor layer 146, the active layer 144, and a portion of the first conductive semiconductor layer 142. Here, the exposed surface of the first conductive semiconductor layer 142 may be located lower than the lower surface of the active layer 144, but the embodiment is not limited thereto.

In addition, in each of the first to $N^{th}$ light-emitting cells P1 to PN, the first electrode 152 may be separately provided on the first conductive semiconductor layer 142, and the first electrode 152 of an $i^{th}$ light-emitting cell (Pi, $1 \leq i \leq N-1$) may be integrally formed with an ith connection wire 124-$i$.

For example, as illustrated in FIG. 4, the first electrode 152 of the fourth light-emitting cell P4 may be disposed separately from the fourth connection wire 124-4, and as illustrated in FIG. 5, the first electrode 152 of the eighth light-emitting cell P8 may be disposed separately from the eighth connection wire 124-8 and the first electrode 152 of the ninth light-emitting cell P9 may be disposed separately from the ninth connection wire 124-9, but the embodiment is not limited thereto.

According to another embodiment, unlike what is illustrated in FIG. 4, the first electrode 152 of the fourth light-emitting cell P4 may be integrally formed with the fourth connection wire 124-4. In addition, unlike what is illustrated in FIG. 5, the first electrode 152 of the eighth light-emitting cell P8 may be integrally formed with the eighth connection wire 124-8. In addition, unlike what is illustrated in FIG. 5, the first electrode 152 of the ninth light-emitting cell P9 may be integrally formed with the ninth connection wire 124-9.

In addition, as illustrated in FIG. 5, the first electrode 152 of the $N^{th}$ light-emitting cell (e.g., P10) may be integrally formed with the second bonding pad 126. However, the embodiment is not limited thereto, and the first electrode 152 of the $N^{th}$ light-emitting cell PN may be formed separately from the second bonding pad 126.

In each of the first to $N^{th}$ light-emitting cells P1 to PN, the second electrode 154 is disposed on the second conductive semiconductor layer 146. For example, referring to FIGS. 3 to 5, in each of the first, second, third, fourth, fifth, eighth, ninth, and tenth light-emitting cells P1, P2, P3, P4, P5, P8, P9 and P10, the second electrode 154 may be disposed on the second conductive semiconductor layer 144.

As illustrated in FIGS. 4 and 5, in each of the first to $N^{th}$ light-emitting cells P1 to PN, the second electrode 154 may be separately disposed on the second conductive semiconductor layer 146, but the embodiment is not limited thereto. That is, according to another embodiment, the second electrode 154 of a $j^{th}$ light-emitting cell (Pj, $2 \leq j \leq N$) may be integrally formed with the j-$1^{th}$ connection wire 124-($j-1$).

In the case of FIG. 4, the second electrode 154 of the fifth light-emitting cell P5 is provided separately from the fourth connection wire 124-4. On the other hand, according to another embodiment, unlike what is illustrated in FIG. 4, the second electrode 154 of the fifth light-emitting cell P5 may be integrally formed with the fourth connection wire 124-4.

In the case of FIG. 5, the second electrode 154 of the ninth light-emitting cell P9 is provided separately from the eighth connection wire 124-8. On the other hand, according to another embodiment, unlike what is illustrated in FIG. 5, the second electrode 154 of the ninth light-emitting cell P9 may be integrally formed with the eighth connection wire 124-8.

In the case of FIG. 5, the second electrode 154 of the tenth light-emitting cell P10 is provided separately from the ninth connection wire 124-9. On the other hand, according to another embodiment, unlike what is illustrated in FIG. 5, the second electrode 154 of the tenth light-emitting cell P10 may be integrally formed with the ninth connection wire 124-9.

In addition, as illustrated in FIG. 3, the second electrode 154 of the first light-emitting cell (e.g. P1) may be integrally formed with the first bonding pad 122. However, the embodiment is not limited thereto, and the second electrode 154 of the first light-emitting cell P1 may be formed separately from the first bonding pad 122.

In each of the first to $N^{th}$ light-emitting cells P1 to PN, each of the first and second electrodes 152 and 154 may have a structure in which an adhesive layer (not illustrated), a barrier layer (not illustrated), and a bonding layer (not illustrated) are sequentially stacked. The adhesive layer of the first electrode 152 may include a material for ohmic contact with the first conductive semiconductor layer 142, and the adhesive layer of the second electrode 154 may include a material for ohmic contact with the second conductive semiconductor layer 146. For example, the adhesive layer may be formed in a single layer or in multiple layers using at least one material of Cr, Rd, or Ti.

The barrier layer may be disposed on the adhesive layer, and may be formed in a single layer or in multiple layers using at least one material of Ni, Cr, Ti, or Pt. For example, the barrier layer may be formed of an alloy of Cr and Pt.

In addition, a reflective layer, which is formed of Ag, for example, may be interposed between the barrier layer and the adhesive layer, but may be omitted. The bonding layer may be disposed on the barrier layer, and may include Au.

A wire (not illustrated) may be bonded to the first bonding pad 122 to supply a first voltage thereto. Referring to FIGS. 2 and 3, the first bonding pad 122 may be disposed on the second conductive semiconductor layer 146 of any one light-emitting cell (e.g. P1) among the first to $N^{th}$ light-emitting cells P1 to PN, and may be in contact with and be electrically connected to the second conductive semiconductor layer 146.

In addition, a wire (not illustrated) may be bonded to the second bonding pad 126 to supply a second voltage thereto. Referring to FIGS. 2, 4 and 5, the second bonding pad 126 may be disposed on the first conductive semiconductor layer 142 of another light-emitting cell (e.g. P=10) among the first to $N^{th}$ light-emitting cells P1 to PN, and may be in electrical contact with the first conductive semiconductor layer 142.

In each of the first to $N^{th}$ light-emitting cells P1 to PN, the conductive layer 110 may further be disposed between the second electrode 154 and the second conductive semiconductor layer 146. Each conductive layer 110 may increase the extraction efficiency of light, which has been discharged from the active layer 144 and passed through the second conductive semiconductor layer 146, since it is capable of reducing total reflection and has high light transmittance. Each conductive layer 110 may be formed in a single layer or in multiple layers using a transparent oxide-based material having high transmittance with respect to a certain emission wavelength, for example, at least one of indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, or Ni/IrOx/Au/ITO.

The area of each conductive layer 110 disposed on the second conductive semiconductor layer 146 may be equal to or less than the top area of the second conductive semiconductor layer 146.

The first to N–$1^{th}$ connection wires 124-1 to 124-(N–1) serve to electrically interconnect the first to $N^{th}$ light-emitting cells P1 to PN. That is, the first to N–$1^{th}$ connection wires 124-1 to 124-(N–1) serve to electrically interconnect the neighboring light-emitting cells. The $i^{th}$ connection wire 124-$i$ (1≤i≤N–1) is located on the $i^{th}$ emission area Pi, the i+$1^{th}$ emission area P(i+1), and a boundary area S between the two Pi and P(i+1), and serves to electrically interconnect the neighboring $i^{th}$ light-emitting cell Pi and i+$1^{th}$ light-emitting cell P(i+1). For example, the first connection wire 124-1 (i=1) serves to electrically interconnect the neighboring first light-emitting cell P1 and second light-emitting cell P2, and as illustrated in FIG. 4, the fourth connection wire 124-4 is located on the fourth emission area P4, the fifth emission area P5, and the boundary area S between the two P4 and P5, and serves to electrically interconnect the neighboring fourth light-emitting cell P4 and fifth light-emitting cell P5.

In the case of FIGS. 2 to 5, it can be appreciated that the first to $N^{th}$ light-emitting cells P1 to PN are electrically connected to each other in series by the first to N–$1^{th}$ connection wires 124-1 to 124-(N–1). The first to N–$1^{th}$ connection wires 124-1 to 124-(N–1) may interconnect the first to $N^{th}$ light-emitting cells P1 to PN in series with the first light-emitting cell P1, in which the first bonding pad 122 is located, as a starting point and the $N^{th}$ light-emitting cell PN, in which the second bonding pad 126 is located, as an ending point. However, the embodiment is not limited thereto, and at least some of the first to $N^{th}$ light-emitting cells P1 to PN may be electrically connected to each other in parallel by the connection wires.

Each of the first to N–$1^{th}$ connection wires 124-1 to 124-(N–1) may be formed of the same material as or a different material from the first and second electrodes 152 and 154. When the first to N–$1^{th}$ connection wires 124-1 to 124-(N–1) are formed of the same material as the first and second electrodes 152 and 154, as described above, the connection wires may be integrally formed with the first or second electrode 152 or 154. Each of the first to N–$1^{th}$ connection wires 124-1 to 124-(N–1) may include at least one of Cr, Rd, Au, Ni, Ti, or Pt, without being limited thereto.

Meanwhile, an insulation layer 160 is disposed between the first to N–$1^{th}$ connection wires 124-1 to 124-(N–1) and the neighboring light-emitting cells, which are connected by the connection wires, to electrically insulate the connection wires from the light-emitting cells. That is, the insulation layer 160 is disposed between the $i^{th}$ connection wire 124-$i$ and the neighboring $i^{th}$ and i+$1^{th}$ light-emitting cells Pi and P(i+1) connected by the wire 124-$i$ to electrically insulate the $i^{th}$ connection wire 124-$i$ from the $i^{th}$ light-emitting cells Pi and electrically insulate the $i^{th}$ connection wire 124-$i$ from the i+$1^{th}$ light-emitting cells P(i+1). For example, referring to FIG. 4, the insulation layer 160 is disposed between the fourth connection wire 124-4 and the neighboring fourth and fifth light-emitting cells P4 and P5 to electrically insulate the fourth connection wire 124-4 from each of the fourth and fifth light-emitting cells P4 and P5. However, the embodiment is not limited thereto. That is, according to another embodiment, the insulation layer 160 may further be disposed on the light-emitting cells P1 to PN and the boundary areas therebetween. That is, the insulation layer 160 may cover the upper surface and the side surface of the light-emitting cells P1 to PN, and may also cover the boundary areas S. The insulation layer 160 may be formed of a light-transmitting insulation material, for example, $SiO_2$, $SiO_x$, $SiO_xN_y$, $Si_3N_4$, or $Al_2O_3$. However, the embodiment is not limited as to a specific arrangement or material of the insulation layer 160.

FIG. 6 illustrates a circuit diagram of the light-emitting element 100 illustrated in FIG. 2.

Referring to FIGS. 2 to 6, the light-emitting element 100 may include a common single (+) terminal, for example, a single first bonding pad 122, and may include a common single (−) terminal, for example, a single second bonding pad 126.

Meanwhile, the respective first to $N^{th}$ light-emitting cells P1 to PN may have different planar areas.

FIG. 7 is a plan view of the light-emitting element 100 illustrated in FIG. 2. The solid line indicates the planar area of each light-emitting cell, and the dotted line indicates the planar area of the active layer 144 (or the second conductive semiconductor layer 146) of each light-emitting cell. Here, "An'" indicates the planar area of the $n^{th}$ light-emitting cell Pn. In addition, in FIG. 7, portions "C" and "D" are given to describe the boundary area S, and for convenience of description, in portions "C" and "D", the dotted line indicating the active layer 144 (or the second conductive semiconductor layer 146) is omitted.

According to the embodiment, in the first to $N^{th}$ light-emitting cells P1 to PN, the other light-emitting cells, excluding the $N^{th}$ light-emitting cell PN in which the second bonding pad 126 is located, i.e. each of the first to N-1$^{th}$ light-emitting cells P1 to P(N-1) may have a planar area smaller than the planar area of the $N^{th}$ light-emitting cell PN. For example, referring to FIG. 7, among the first to tenth light-emitting cells P1 to P10, the planar areas A1' to A9' of the first to ninth light-emitting cells P1 to P9, excluding the tenth light-emitting cell P10 in which the second bonding pad 126 is located, may be smaller than the planar area A10' of the tenth light-emitting cell P10.

As described above, the reason why the planar areas A1' to A9' of the first to N-1$^{th}$ light-emitting cells P1 to P(N-1) are smaller than the planar area A10' of the $N^{th}$ light-emitting cell PN is because the second bonding pad 126 is disposed on the $N^{th}$ light-emitting cell PN, and therefore the planar area of the active layer 144 of the $N^{th}$ light-emitting cell PN may be equal to or less than the planar area of the active layers 144 of the first to N-1$^{th}$ light-emitting cells P1 to P(N-1). When the planar area of the active layer 144 of the $N^{th}$ light-emitting cell PN is equal to or less than the planar area of the active layer 144 of the first to N-1$^{th}$ light-emitting cells P1 to P(N-1), the current density of the $N^{th}$ light-emitting cell PN becomes higher than the current density of the first to N-1$^{th}$ light-emitting cells P1 to P(N-1), which may cause damage to the light-emitting element. To prevent this, according to the embodiment, the planar area AN' of the $N^{th}$ light-emitting cell PN may be larger than the the planar areas A1' to A(N-1)' of the other light-emitting cells P1 to P(N-1).

In order to increase the planar area of the $N^{th}$ light-emitting cell PN compared to the planar area of the other light-emitting cells P1 to P(N-1), the horizontal width Y of the $N^{th}$ light-emitting cell PN may be designed to be larger than the horizontal width of the other light-emitting cells P1 to P(N-1), and the vertical width Z of the $N^{th}$ light-emitting cell PN may be designed to be equal to the vertical width of the other light-emitting cells P1 to P(N-1).

Alternatively, in order to increase the planar area of the $N^{th}$ light-emitting cell PN compared to the planar area of the other light-emitting cells P1 to P(N-1), the vertical width Z of the $N^{th}$ light-emitting cell PN may be designed to be larger than the vertical width of the other light-emitting cells P1 to P(N-1), and the horizontal width Y of the $N^{th}$ light-emitting cell PN may be designed to be equal to the horizontal width of the other light-emitting cells P1 to P(N-1).

Alternatively, in order to increase the planar area of the $N^{th}$ light-emitting cell PN compared to the planar area of the other light-emitting cells P1 to P(N-1), the vertical width Z of the $N^{th}$ light-emitting cell PN may be designed to be larger than the vertical width of the other light-emitting cells P1 to P(N-1), and the horizontal width Y of the $N^{th}$ light-emitting cell PN may be designed to be larger than the horizontal width of the other light-emitting cells P1 to P(N-1).

FIG. 8 illustrates an enlarged cross-sectional view of portion "A" illustrated in FIG. 2, and FIG. 9 illustrates a cross-sectional view of a comparative example of portion "A" illustrated in FIG. 2.

When the first to $N^{th}$ light-emitting cells P1 to PN have the same planar area, or when the difference in planar area between the first to $N^{th}$ light-emitting cells P1 to PN is not great, as illustrated in FIG. 9, the boundary regions S located between the adjacent light-emitting cells (e.g. P5, P6, P9 and P10) are arranged in a line with each other, rather than being out of line in the y-axis or the z-axis direction.

On the other hand, when at least one of the horizontal width Y or the vertical width Z of the $N^{th}$ light-emitting cell PN is increased as in the embodiment, as illustrated in FIG. 8, the boundary regions S located between the adjacent light-emitting cells (e.g. P5, P6, P9 and P10) may be out of line with each other in the y-axis or the z-axis direction. This will be described below in detail.

The first to $N^{th}$ light-emitting cells P1 to PN may include first adjacent light-emitting cells and second adjacent light-emitting cells. Here, the first adjacent light-emitting cells may mean light-emitting cells that are disposed adjacent to each other in a first direction, among the first to $N^{th}$ light-emitting cells P1 to PN. The second adjacent light-emitting cells may mean light-emitting cells that are adjacent to the first adjacent light-emitting cells in a second direction, which is orthogonal to the first direction, and are disposed adjacent to each other in the first direction, among the first to $N^{th}$ light-emitting cells P1 to PN.

Hereinafter, in order to assist the understanding of the first adjacent light-emitting cells and the second adjacent light-emitting cells, assuming that the first direction is the z-axis direction and the second direction is the y-axis direction, the first adjacent light-emitting cells and the second adjacent light-emitting cells will be described as follows. In addition, each of the first and second directions may be orthogonal to the thickness direction (e.g. the x-axis direction) of the substrate 130.

In one example, the first light-emitting cell P1 and the second light-emitting cell P2 are adjacent to each other in the z-axis direction, which is the first direction, and therefore, may correspond to the first adjacent light-emitting cells. When the first light-emitting cell P1 and the second light-emitting cell P2 correspond to the first adjacent light-emitting cells, the sixth and seventh light-emitting cells P6 and P7 are adjacent to the first adjacent light-emitting cells P1 and P2 in the y-axis direction, which is the second direction, and are adjacent to each other in the z-axis direction, which is the first direction, and therefore, may correspond to the second adjacent light-emitting cells.

In another example, the third light-emitting cell P3 and the fourth light-emitting cell P4 are adjacent to each other in the z-axis direction, which is the first direction, and therefore, may correspond to the first adjacent light-emitting cells. When the third light-emitting cell P3 and the fourth light-emitting cell P4 correspond to the first adjacent light-emitting cells, the fifth and sixth light-emitting cells P5 and P6 are adjacent to the first adjacent light-emitting cells P3 and P4 in the y-axis direction, which is the second direction, and are adjacent to each other in the z-axis direction, which is the first direction, and therefore, may correspond to the second adjacent light-emitting cells.

In still another example, the sixth light-emitting cell P6 and the seventh light-emitting cell P7 are adjacent to each other in the z-axis direction, which is the first direction, and therefore, may correspond to the first adjacent light-emitting cells. When the sixth light-emitting cell P6 and the seventh light-emitting cell P7 correspond to the first adjacent light-emitting cells, the eighth and ninth light-emitting cells P8 and P6 are adjacent to the first adjacent light-emitting cells P6 and P7 in the y-axis direction, which is the second direction, and are adjacent to each other in the z-axis direction, which is the first direction, and therefore, may correspond to the second adjacent light-emitting cells. In addition, when the sixth light-emitting cell P6 and the seventh light-emitting cell P7 correspond to the first adjacent light-emitting cells, the first and second light-emitting cells P1 and P2 are adjacent to the first adjacent light-emitting cells P6 and P7 in the y-axis direction, which is the second direction, and are adjacent to each other in the z-axis direction, which is the first direction, and therefore, may correspond to the second adjacent light-emitting cells.

In a further example, the fifth light-emitting cell P5 and the sixth light-emitting cell P6 are adjacent to each other in the z-axis direction, which is the first direction, and therefore, may correspond to the first adjacent light-emitting cells. When the fifth light-emitting cell P5 and the sixth light-emitting cell P6 correspond to the first adjacent light-emitting cells, the ninth and tenth light-emitting cells P9 and P10 are adjacent to the first adjacent light-emitting cells P5 and P6 in the y-axis direction, which is the second direction, and are adjacent to each other in the z-axis direction, which is the first direction, and therefore, may correspond to the second adjacent light-emitting cells. In addition, when the fifth light-emitting cell P5 and the sixth light-emitting cell P6 correspond to the first adjacent light-emitting cells, the third and fourth light-emitting cells P3 and P4 are adjacent to the first adjacent light-emitting cells P5 and P6 in the y-axis direction, which is the second direction, and are adjacent to each other in the z-axis direction, which is the first direction, and therefore, may correspond to the second adjacent light-emitting cells.

In addition, the boundary areas S may include first, second, and third boundary areas S1, S2 and S3. The first boundary area S1 may mean the boundary area S disposed between the first adjacent light-emitting cells. The second boundary area S2 may mean the boundary area that is disposed between the second adjacent light-emitting cells and is spaced apart from the first boundary area S1 in the first direction. The third boundary area S3 may mean the boundary area disposed between the first adjacent light-emitting cells and the second adjacent light-emitting cells.

For example, referring to "C" illustrated in FIG. 7, it can be appreciated that, assuming that the first and second light-emitting cells P1 and P2 correspond to the first adjacent light-emitting cells and the sixth and seventh light-emitting cells P6 and P7 correspond to the second adjacent light-emitting cells, the first boundary area S1 is disposed between the first adjacent light-emitting cells P1 and P2 and the second boundary area S2 is disposed between the second adjacent light-emitting cells P6 and P7. Here, it can be appreciated that the first boundary area S1 and the second boundary area S2 are spaced apart from each other in the z-axis direction, which is the first direction. In this case, it can be appreciated that the third boundary area S3 is disposed between the first boundary area S1 and the second boundary area S2.

In addition, referring to "D" illustrated in FIG. 7, it can be appreciated that, assuming that the fifth and seventh light-emitting cells P5 and P6 correspond to the first adjacent light-emitting cells and the ninth and tenth light-emitting cells P9 and P10 correspond to the second adjacent light-emitting cells, the first boundary area S1 is disposed between the first adjacent light-emitting cells P5 and P6 and the second boundary area S2 is disposed between the second adjacent light-emitting cells P9 and P10. Here, it can be appreciated that the first boundary area S1 and the second boundary area S2 are spaced apart from each other in the z-axis direction, which is the first direction. In this case, it can be appreciated that the third boundary area S3 is disposed between the first boundary area S1 and the second boundary area S2.

The first and second boundary areas S1 and S2 are not disposed on the same line in the second direction (e.g. the y-axis direction), but spaced apart from each other in the first direction (e.g. the z-axis direction). As such, according to the embodiment, since the first and second boundary areas S1 and S2 are not disposed on the same line, light scattering may occur in at least one of the region between the first boundary area S1 and the third boundary area S3, the region between the second boundary area S2 and the third boundary area S3, or the third boundary area S3, which may enhance the uniformity of light of the light-emitting element 100.

In addition, among the first to $N^{th}$ light-emitting cells P1 to PN, the planar areas A' to A(N−1)' of the first to N−1$^{th}$ light-emitting cells P1 to P(N−1), excluding the $N^{th}$ light-emitting cell PN, may be the same or different.

When the uniformity of the active layer 144 of the $N^{th}$ light-emitting cell PN, in which the second bonding pad 126 is located, and the active layers 144 of the first to N−1$^{th}$ light-emitting cells P1 to P(N−1) is above 1%, damage to the element may occur due to the difference in current density between the first to $N^{th}$ light-emitting cells P1 to PN. In addition, in consideration of manufacturing tolerance of the light-emitting element, it may be difficult to realize a light-emitting element in which the uniformity of the active layers 144 of the first to N−1$^{th}$ light-emitting cells P1 to P(N−1) is below 0.01%. Thus, the uniformity of the active layers 144 of the first to $N^{th}$ light-emitting cells PN may range from 0.01% to 1%, but the embodiment is not limited thereto.

In addition, the planar areas of the first to N−1$^{th}$ light-emitting cells P1 to P(N−1) may be different as long as the uniformity of the active layers 144 of the first to N−1$^{th}$ light-emitting cells P1 to P(N−1) falls within a range from 0.01% to 1%.

In addition, among the first to $N^{th}$ light-emitting cells P1 to PN, the major-axis direction (or the minor-axis direction) of some light-emitting cells may be different from the major-axis direction (or the minor-axis direction) of the other light-emitting cells among the first to $N^{th}$ light-emitting cells P1 to PN. For example, the major-axis direction of the first to fourth light-emitting cells P1 to P4 may be, for example, the y-axis direction, whereas the major-axis direction of the fifth to tenth light-emitting cells P5 to P10 may be, for example, the z-axis direction, so as to be different from that of the first to fourth light-emitting cells. When the major-axes or minor-axes directions of the light-emitting cells are different, the first boundary area S1 and the second boundary area S2 may further be spaced apart from each other in the first direction (e.g. the z-axis direction). That is, the extent (e.g. the distance) within which the first and second boundary areas S1 and S2 are spaced farther apart from each other in the first direction in the enlarged portion D of FIG. 7 may be smaller than the extent within which the first boundary area S1 and the second boundary area S2 are spaced apart from each other in the enlarged portion C of FIG. 7. As such, the greater the distance between the first and second boundary areas S1 and S2, the more active the scattering of light may become, and thus the uniformity of light emitted from the light-emitting element 100 may be further enhanced.

In conclusion, according to the embodiment, since the boundary areas S may be arranged in various ways in the first and second directions, which are orthogonal to the thickness direction of the light-emitting element 100, in a plane, the extent within which the first and second boundary areas S1 and S2 are spaced apart from each other may be freely adjusted, which improves light uniformity.

Hereinafter, when the first to N−1$^{th}$ light-emitting cells P1 to P(N−1) have the same planar area (hereinafter referred to as the "first planar area"), the degree by which the planar area AN' of the N$^{th}$ light-emitting cell (hereinafter referred to as the "second planar area") is greater than a first planar area Ai' (1≤i≤N−1) will be described below.

For convenience of description, the concept of a reference planar area AR is introduced. The reference planar area AR may be defined through the following Equation 1, as illustrated in FIG. 7.

Equation 1

$$AR = y1 \times z1 \qquad \text{Eq. 1}$$

Here, "y1" and "z1" respectively indicate the horizontal length and the vertical length of the reference planar area AR.

According to the embodiment, the second planar area AN' may be greater than the reference planar area AR by an incremental amount α, and may be represented through the following Equation 2.

Equation 2

$$AN' = AR + \alpha \qquad \text{Eq. 2}$$

Here, the first planar area Ai' may be represented through the following Equation 3.

Equation 3

$$Ai' = AR - \frac{\alpha}{(N-1)} \qquad \text{Eq. 3}$$

When subtracting the first planar area Ai' of Equation 3 from the second planar area AN' of Equation 2, the degree Δ by which the second planar area AN' is greater than the first planar area Ai' may be represented through the following Equation 4.

Equation 4

$$\Delta = AN' - Ai' = \frac{\alpha N}{(N-1)} \qquad \text{Eq. 4}$$

FIG. 10 illustrates a plan view of a light-emitting element according to a comparative example.

Referring to FIG. 10, the light-emitting element according to the comparative example includes first to tenth light-emitting cells, and the planar areas of the first to tenth light-emitting cells are designated by A1 to A10, respectively. Here, A1 to A10 may be the same or different. It is assumed that each of A1 to A10 is equal to or substantially close to the reference planar area AR. In this case, when the second bonding pad 126 is disposed in the tenth light-emitting cell, the area occupied by the active layer 144 of the second planar area A10 of the tenth light-emitting cell becomes smaller than the area occupied by the active layer 144 of the first planar area AR of the first to ninth light-emitting cells. Due to this, the uniformity of the planar areas of the active areas in the first to tenth light-emitting cells may be deteriorated.

On the other hand, according to the embodiment, the second planar area AN' of the tenth light-emitting cell, in which the second bonding pad 126 is disposed, is increased compared to the reference planar area AR by the incremental amount α, whereas the sum of the first planar areas Ai' of the first to ninth light-emitting cells is reduced by the incremental amount α. At this time, when the incremental amount α of the above-described Equation 4 is set to the planar area occupied by the second bonding pad 126, the uniformity of the planar areas of the active layers 144 of the first to tenth light-emitting cells may fall within a range from 0.01% to 1%.

As described above, by increasing the planar area of the N$^{th}$ light-emitting cell PN, the uniformity of the planar areas of the active layers 144 included in the first to N$^{th}$ light-emitting cells P1 to PN may range from 0.01% to 1%, for example, may be 0.03%, but the embodiment is not limited to a specific value of the uniformity.

Hereinafter, the uniformity of the active layers in the light-emitting elements according to the comparative example and the embodiment will be described below with reference to the accompanying drawings.

Prior to describing the uniformity of the planar areas of the active layers in the light-emitting cells, the uniformity of the planar areas may be represented through the following Equation 5.

Equation 5

$$U = \frac{\text{Max} - \text{Min}}{\text{Max} + \text{Min}} \times 100 \qquad \text{Eq. 5}$$

Here, "U" indicates the uniformity of the planar areas, "Max" indicates the maximum value of the planar area, and "Min" indicates the minimum value of the planar area.

The planar areas of the active layers in the first to tenth light-emitting cells P1 to P10 in the light-emitting element according to the comparative example illustrated in FIG. 10 may be as in the following Table 1.

TABLE 1

| Sort | A(μm²) | Uniformity(U) (%) |
|------|--------|-------------------|
| P1   | 136649 | 6.54              |
| P2   | 136649 |                   |
| P3   | 136649 |                   |
| P4   | 137144 |                   |
| P5   | 127007 |                   |
| P6   | 127007 |                   |
| P7   | 127007 |                   |
| P8   | 127007 |                   |
| P9   | 127007 |                   |
| P10  | 120313 |                   |

Here, "A" indicates the planar area of the active layer in each of the light-emitting cells P1 to P10.

On the other hand, in the light-emitting element 100 according to the embodiment illustrated in FIG. 7, the planar area of the active layer in each of the first to tenth light-emitting cells P1 to P10 may be as in the following Table 2.

TABLE 2

| Sort | A(μm²) | Uniformity(U) (%) |
|------|--------|-------------------|
| P1   | 130833 | 0.03              |
| P2   | 130833 |                   |
| P3   | 130833 |                   |
| P4   | 130833 |                   |

TABLE 2-continued

| Sort | A(µm²) | Uniformity(U) (%) |
|------|--------|-------------------|
| P5   | 130844 |                   |
| P6   | 130844 |                   |
| P7   | 130844 |                   |
| P8   | 130857 |                   |
| P9   | 130857 |                   |
| P10  | 130900 |                   |

Comparing Table 1 and Table 2 with each other, it can be appreciated that the uniformity of planar areas of the light-emitting element according to the embodiment is superior to that of the comparative example.

FIG. 11 illustrates the current densities #1 to #10 of the first to tenth light-emitting cells P1 to P10 in the light-emitting element according to the comparative example illustrated in FIG. 10, and FIG. 12 illustrates the current densities #1 to #10 of first to tenth light-emitting cells P1 to P10 in the light-emitting element 100 according to the embodiment. Here, the horizontal axis indicates current, and the vertical axis indicates the current density.

Referring to FIG. 11, in the case of the light-emitting element according to the comparative example, since the planar areas of the active layers in the first to tenth light-emitting cells P1 to P10 are not uniform, there is a difference between the current densities #1 to #10 of the first to tenth light-emitting cells. Due to this, a connection electrode connected to the tenth light-emitting cell may be damaged and electrically opened, which may deteriorate the reliability of the element.

On the other hand, Referring to FIG. 12, in the case of the light-emitting element 100 according to the embodiment, since the planar areas of the active layers are uniform, there is no difference between the current densities #1 to #10 of the first to tenth light-emitting cells P1 to P10. Due to this, it is possible to prevent deterioration in reliability due to damage to the tenth light-emitting cell P10. Accordingly, the light-emitting element 100 according to the embodiment may reduce a defect rate under the occurrence of any abnormal situation such as overcurrent or electrostatic discharge (ESD), and may be suitably used for a high-voltage element.

A plurality of light-emitting element packages including the light-emitting element according to the embodiment may be arranged on a board, and optical members such as a light guide plate, a prism sheet, and a diffuser sheet may be disposed on the optical path of the light-emitting element packages. The light-emitting element packages, the board, and the optical members may function as a backlight unit.

In addition, the light-emitting element according to the embodiment may be applied to display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module that includes a board and the light-emitting element package according to the embodiments, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light-emitting module that includes light-emitting element packages disposed on a board, a reflector that reflects light emitted from the light-emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Modes for the implementation of embodiments have sufficiently been described in the "best mode" described above.

INDUSTRIAL APPLICABILITY

A light-emitting element according to the embodiment may be used in a display apparatus, an indicator apparatus, and a lighting apparatus, for example.

The invention claimed is:

1. A light-emitting element, comprising:
   a substrate;
   a plurality of light-emitting cells arranged on the substrate and spaced apart from each other, each of the light-emitting cells comprising a first conductive semiconductor layer, an active layer, and a second conductive semiconductor layer sequentially disposed on the substrate;
   a connection wire configured to electrically interconnect the light-emitting cells;
   a first bonding pad electrically connected to the second conductive semiconductor layer of a first light-emitting cell among the light-emitting cells; and
   a second bonding pad electrically connected to the first conductive semiconductor layer of a second light-emitting cell among the light-emitting cells,
   wherein at least one remaining light-emitting cell, excluding the second light-emitting cell, among the light emitting cells, has a planar area smaller than a planar area of the second light-emitting cell,
   wherein the light-emitting cells are separated from each other on a plane by a boundary area located around the light-emitting cells,
   wherein the light-emitting cells comprise:
      first adjacent light-emitting cells adjacent to each other in a first direction; and second adjacent light-emitting cells adjacent to each other in the first direction and adjacent to the first adjacent light-emitting cells in a second direction orthogonal to the first direction,
wherein the boundary area comprises:
  a first boundary area disposed between the first adjacent light-emitting cells; and
  a second boundary area disposed between the second adjacent light-emitting cells and spaced apart from the first boundary area in the first direction, and
wherein all boundary areas which are disposed between the light-emitting cells adjacent to each other in the first direction among the plurality of light-emitting cells are spaced apart from each other in the first direction.

2. The light-emitting element according to claim 1, wherein a uniformity of planar areas of the active layers of the light-emitting cells ranges from 0.01% to 1%.

3. The light-emitting element according to claim 2, wherein the uniformity of the planar areas of the active layers of the light-emitting cells is 0.03%.

4. The light-emitting element according to claim 2, wherein the at least one remaining light-emitting cell comprises a plurality of remaining light-emitting cells, and planar areas of the remaining light-emitting cells are different within the range of the uniformity.

5. The light-emitting element according to claim 1, wherein the second light-emitting cell has a horizontal width greater than a horizontal width of the at least one remaining light-emitting cell and a vertical width equal to a vertical width of the at least one remaining light-emitting cell.

6. The light-emitting element according to claim 1, wherein the second light-emitting cell has a horizontal width greater than a horizontal width of the at least one remaining light-emitting cell and a vertical width greater than a vertical width of the at least one remaining light-emitting cell.

7. The light-emitting element according to claim 1, wherein one or more of the light-emitting cells have a major-axis or minor-axis direction different from a major-axis or minor-axis direction of the remaining light-emitting cells among the light-emitting cells, and a major-axis or minor-axis direction of the second light-emitting cell is different from a major-axis or minor-axis direction of the first light-emitting cell.

8. A light-emitting element comprising:
a substrate;
first to $N^{th}$ light-emitting cells disposed on the substrate and spaced apart from each other (here, "N" is a positive integer of 2 or more);
first to $N-1^{th}$ connection wires configured to electrically interconnect the first to $N^{th}$ light-emitting cells;
a first bonding pad located in the first light-emitting cell among the first to $N^{th}$ light-emitting cells; and
a second bonding pad located in the $N^{th}$ light-emitting cell among the first to $N^{th}$ light-emitting cells,
wherein each light-emitting cell, excluding the $N^{th}$ light-emitting cell, among the first to $N^{th}$ light-emitting cells has a first planar area as follows:

$$Ai' = AR - \frac{\alpha}{(N-1)}$$

(here, "Ai'" indicates the first planar area, "AR" indicates the reference planar area, and "α" indicates the incremental amount),
wherein the first to $N^{th}$ light-emitting cells are separated from each other on a plane by a boundary area located around the first to $N^{th}$ light-emitting cells,
wherein the first to $N^{th}$ light-emitting cells comprise:
  first adjacent light-emitting cells adjacent to each other in a first direction; and
  second adjacent light-emitting cells adjacent to each other in the first direction and adjacent to the first adjacent light-emitting cells in a second direction orthogonal to the first direction,
wherein the boundary area comprises:
  a first boundary area disposed between the first adjacent light-emitting cells; and
  a second boundary area disposed between the second adjacent light-emitting cells and spaced apart from the first boundary area in the first direction, and
wherein all of boundary areas which are disposed between the light-emitting cells adjacent to each other in the first direction among the first to $N^{th}$ light-emitting cells are spaced apart from each other in the first direction.

9. The light-emitting element according to claim 8, wherein each of the first to $N^{th}$ light-emitting cells comprises:
an n-type semiconductor layer disposed on the substrate;
an active layer disposed on the n-type semiconductor layer;
a p-type semiconductor layer disposed on the active layer;
an n-type electrode disposed on the n-type semiconductor layer that is exposed by mesa etching the p-type semiconductor layer and the active layer; and
a p-type electrode disposed on the p-type semiconductor layer.

10. The light-emitting element according to claim 8, wherein one or more of the first to $N^{th}$ light-emitting cells have a major-axis or minor-axis direction different from a major-axis or minor-axis direction of the remaining light-emitting cells among the first to $N^{th}$ light-emitting cells, and a major-axis or minor-axis direction of the $N^{th}$ light-emitting cell is different from a major-axis or minor-axis direction of the first light-emitting cell.

11. The light-emitting element according to claim 2, wherein the at least one remaining light-emitting cell comprises a plurality of remaining light-emitting cells, and
wherein planar areas of the remaining light-emitting cells are the same.

12. The light-emitting element according to claim 2, wherein a first planar area of the at least one remaining light-emitting cell, excluding the second light-emitting cell, among the light-emitting cells, and a second planar area of the second light-emitting cell have a relationship as follows:

$$AN' - Ai' = \frac{\alpha N}{(N-1)}$$

where, "Ai'" indicates the first planar area, $1 \leq i \leq N-1$, "AN'" indicates the second planar area, "N" indicates a total number of light-emitting cells and is a positive integer of 2 or more, and "α" indicates a planar area of the second bonding pad.

13. The light-emitting element according to claim 1, wherein the second light-emitting cell has a vertical width greater than a vertical width of the at least one remaining light-emitting cell and a horizontal width equal to a horizontal width of the at least one remaining light-emitting cell.

14. The light-emitting element according to claim 1, wherein the first conductive semiconductor layer is an n-type semiconductor layer, the second conductive semiconductor layer is a p-type semiconductor layer, and each of the light-emitting cells has a horizontal bonding structure.

15. The light-emitting element according to claim 8, wherein a second planar area of the $N^{th}$ light-emitting cell is greater than a reference planar area by an incremental amount.

16. The light-emitting element according to claim 15, wherein a uniformity of planar areas of the active layers of the first to $N^{th}$ light-emitting cells ranges from 0.01% to 1%.

17. The light-emitting element according to claim 15, wherein the incremental amount is equal to a planar area of the second bonding pad.

18. A light-emitting element, comprising:
a substrate;
a plurality of light-emitting cells arranged on the substrate and spaced apart from each other, each of the light-emitting cells comprising a first conductive semiconductor layer, an active layer, and a second conductive semiconductor layer sequentially disposed on the substrate;
a connection wire configured to electrically interconnect the light-emitting cells;
a first bonding pad electrically connected to the second conductive semiconductor layer of a first light-emitting cell among the light-emitting cells; and
a second bonding pad electrically connected to the first conductive semiconductor layer of a second light-emitting cell among the light-emitting cells,
wherein the light-emitting cells are separated from each other on a plane by a boundary area located around the light-emitting cells,
wherein the boundary area comprises a first boundary disposed between the light-emitting cells adjacent to each other in a first direction among the plurality of light-emitting, and
wherein all of the first boundary areas are spaced apart from each other in the first direction.

19. The light-emitting element according to claim 18, wherein at least one remaining light-emitting cell, excluding the second light-emitting cell, among the light emitting cells, has a planar area smaller than a planar area of the second light-emitting cell.

20. The light-emitting element according to claim 18, wherein the light-emitting cells comprise:
first adjacent light-emitting cells adjacent to each other in a first direction; and
second adjacent light-emitting cells adjacent to each other in the first direction and adjacent to the first adjacent light-emitting cells in a second direction orthogonal to the first direction.

* * * * *